(12) United States Patent
Cho et al.

(10) Patent No.: US 7,375,559 B1
(45) Date of Patent: May 20, 2008

(54) DIFFERENTIAL COMPARATOR WITH A REPLICA INPUT STAGE TO SET THE ACCURATE BIAS CURRENT FOR IMPROVED COMMON MODE REJECTION

(75) Inventors: Thomas Cho, Fremont, CA (US);
Xiaoyue Wang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 186 days.

(21) Appl. No.: 11/176,998

(22) Filed: Jul. 7, 2005

(51) Int. Cl.
*H03K 5/22* (2006.01)
*G06G 7/12* (2006.01)

(52) U.S. Cl. .......................... 327/65; 327/66; 327/67; 327/69; 327/74; 327/82; 327/563; 327/359

(58) Field of Classification Search .................. 327/66, 327/67, 69, 74, 82, 87, 563, 77, 65
See application file for complete search history.

(56) References Cited

U.S. PATENT DOCUMENTS 4,162,454 A * 7/1979 Olsen .......................... 327/72

7,064,595 B2 * 6/2006 Sharma et al. .............. 327/205

OTHER PUBLICATIONS

Sedra and Smith, "Microelectronic Circuits." 2004. Oxford University Press. Fifth Edition. p. 728.*

* cited by examiner

*Primary Examiner*—Quan Tra
*Assistant Examiner*—Colleen O'Toole

(57) ABSTRACT

Methods and apparatus for properly biasing differential comparators are provided. Using a feedback relationship, a bias for a main stage that receives a first differential input of the comparator is produced. Separately, a feedback relationship produces a bias for a main stage that receives a second differential input. These biases, produced as a result of the feedback relationship between bias stages and stages that replicate the main stages, are applied to the main stages. The outputs of the differential comparator are differential outputs with improved common-mode rejection as a result of the feedback and replica biasing.

45 Claims, 7 Drawing Sheets

DIFFERENTIAL COMPARATOR WITH A REPLICA INPUT STAGE TO SET THE ACCURATE BIAS CURRENT FOR IMPROVED COMMON MODE REJECTION

BACKGROUND OF THE INVENTION

The accurate operation of differential comparators implemented using two source coupled pairs depends on good matching of the tail current sources. Such comparators can have poor rejection of the common mode signals, especially at low voltages. The poor rejection at low voltages is due mainly to the difficulty of biasing matched current sources well because of reduced voltage headroom available at low voltages.

Common mode differences can also result for several reasons. For example, if the two differential input signals come from circuits powered by two different power supplies, the finite voltage drop on the ground line can result in common mode differences. In addition, common mode difference can result from mismatches of the devices that generate the common voltage.

For the above reasons, a low voltage differential comparator can have a large offset appearing at its output. As an example, if offset appears at a differential output of a circuit, the difference between differential outputs may be taken to be positive when, had it not been for the offset, the output would have been negative. If the circuit is a comparator, the comparator (at a latch stage) may mistakenly output a high signal (e.g., the first differential output is greater than the second differential output) instead of a low signal.

It is therefore an object of the present invention to provide a differential comparator that is less sensitive to common mode differences.

SUMMARY OF THE INVENTION

The present invention provides a differential comparator that is less sensitive to common mode differences. A feedback relationship is created such that those portions of the circuit that generate output signals are properly biased for common mode rejection.

Differential inputs along with reference signals are applied to main stages of the comparator. These input signals are also applied to replica stages which replicate the main stages. In particular, an "N-side" differential input signal is input into an N-side main stage and an N-side replica stage. A "P-side" differential input signal is input into a P-side main stage and a P-side replica stage. Reference signals are also applied to respective main and replica stages. The differential input signals (as well as the main and replica stages) are referred to as "N-side" and "P-side" merely for sake of clarity and do not necessarily connotate negative or positive differential input signals.

Using current and voltage relationships of a replica stage, a feedback relationship is created that biases a replica bias stage. This bias is applied to a respective (e.g., N-side or P-side) main bias stage. The main bias stages bias the main stages of the comparator for common mode rejection. The outputs of the main stages, based on respective differential inputs and reference signals, are cross-coupled resulting in a properly biased differential pair.

The present invention can be used in connection with low voltage differential comparators. Such low voltage differential comparators—which operate up to, for example, about 1.8V—have excellent common mode rejection even when the tail current sources are pushed into the deep triode region. This is a marked improvement over known low voltage differential comparators. Additionally, the present invention can be used in connection with other differential comparators.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
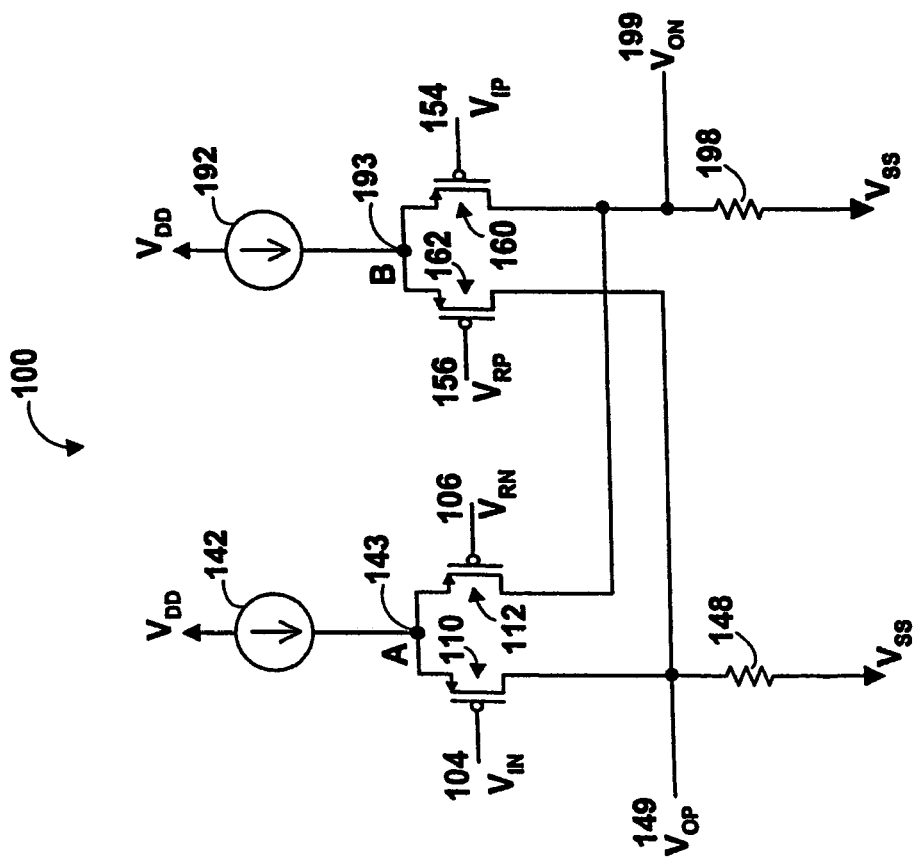
FIG. 1 is a known differential comparator.

FIG. 1 is a known differential comparator 100. As shown, a first input signal 104 ("$V_{IN}$") and a second input signal 154 ("$V_{IP}$") to be compared are input into comparator 100. In addition to signals 104 and 154, reference signals 106 ("$V_{RN}$") and 156 ("$V_{RP}$") are input into comparator 100.

Signals 104, 106, 154, and 156 drive transistors 110, 112, 160, and 162 respectively. Current, supplied by constant current source 142, passes through transistors 110 and 112 based on the strength of signals 104 and 106, respectively. Similarly, constant current source 192 supplies current that passes through transistors 160 and 162 depending on the strength of signals 154 and 156, respectively. Current sources 142 and 192 may be coupled to a positive power supply (e.g., "$V_{DD}$").

As illustrated in FIG. 1, the outputs of transistors 110 and 162 are coupled. In addition, the outputs of transistors 160 and 112 are coupled. These "cross-coupled" outputs are applied to resistors 148 and 198. In some known comparators resistors 148 and 198 have equal resistance and have one end tied to a negative power supply (e.g., "$V_{SS}$"). The voltage across resistor 148 ("$V_{OP}$")—measured at node 149—is compared to the voltage across resistor 198 ("$V_{ON}$")—measured at node 199. The voltages at nodes 149 and 199 may be compared at, for example, a comparator latch stage to determine which voltage is higher.

In some known comparators, current sources 142 and 192 have been implemented as transistors. The voltage at node A (i.e., node 143) and the voltage at node B (i.e., node 193) might be different because signals 104, 106, 154, and 156 vary. Thus, there is a mismatch of the current values from current sources 142 and 192 due to channel-length modulation effect. The result is offset at the output of the comparator.

Figure 2:
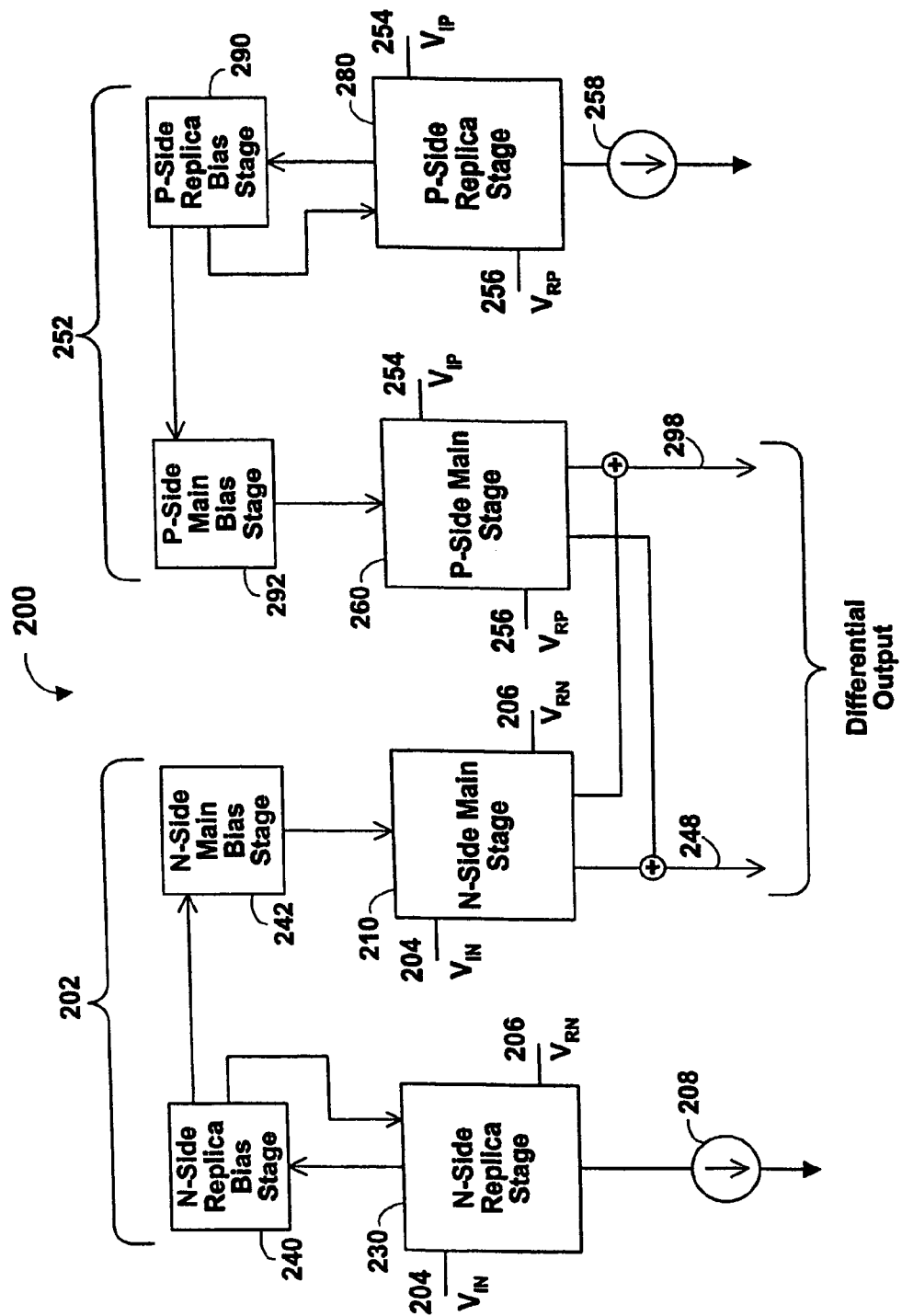
FIG. 2 is a generalized block diagram of a differential comparator of the present invention.

Turning to FIG. 2, the present invention uses feedback relationships and replica circuits to set bias voltages. These bias voltages are applied to a current source that drives the main stages of a differential comparator. The outputs of the main stage are properly biased and cross-coupled. The circuit rejects common mode differences between the input signals $V_{IP}$ and $V_{IN}$, and the reference signals $V_{RP}$ and $V_{RN}$.

In particular, the present invention applies voltage inputs and reference signals to an N-side main stage, a P-side main stage, and two replica stages that individually replicate the N-side main stage and P-side main stage, respectively. Using a feedback relationship, a bias voltage to properly bias a main stage is produced by a respective replica stage in conjunction with a replica bias stage. For example, when a voltage input and a voltage reference signal are applied to the N-side replica stage, a feedback relationship with the N-side replica bias stage produces a bias voltage.

The bias voltage produced by the N-side replica stage and N-side replica bias stage is applied to an N-side main bias stage. Similarly, a bias voltage produced by the P-side replica stage and P-side replica bias stage is applied to a P-side main bias stage. The N-side and P-side main bias stages bias the N-side and P-side main stages, respectively.

When these main stages are biased in this manner and the main stages receive the same voltage input and reference signals as applied to the N-side and P-side replica stages, the result is improved common mode rejection. When used in connection with low voltage differential comparators (up to about 1.8V), the present invention can reject common mode voltages even when the current sources are pushed into the deep triode region. This is merely exemplary. As stated previously, the present invention can be used in connection with other differential comparators.

FIG. 2 illustrates a generalized block diagram of a differential comparator 200 in accordance with the present invention. Comparator 200 has an N-side 202 and a P-side 252 which operate similarly apart from the input signals applied to them. Comparator 200 is described as having an N-side 202 and a P-side 252 solely for ease of description but do not necessarily connotate a side to which a negative or positive differential input is to be applied. As will be described in more detail below, the outputs of N-side 202 and P-side 252 are cross-coupled.

N-side 202 of comparator 200 includes an N-side main stage 210 and an N-side replica stage 230. A voltage input 204, "$V_{IN}$," and a voltage reference signal 206, "$V_{RN}$," are applied to both main stage 210 and replica stage 230.

N-side replica stage 230 is driven by current source 208. Current source 208 also drives N-side replica bias stage 240. The current driven through replica stage 230 and replica bias stage 240 will remain constant. However, voltages internal to the replica stage 230 may vary. As a result, the voltages internal to replica bias stage 240 may also vary. Based on the voltages internal to replica stage 230, a bias voltage is applied to replica bias stage 240. The bias voltage applied to replica bias stage 240 is also applied to N-side main bias stage 242. The replica bias of replica bias stage 240 is determined using feedback based on internal voltages of replica stage 230. As shown in FIG. 2, current and voltage information from N-side replica bias stage 240 is fed back via a feedback loop to N-side replica stage 230. This feedback relationship will be described in greater detail in connection with FIG. 3. The feedback creates the bias voltage for N-side main bias stage 242. This bias voltage is translated into a current which drives N-side main stage 210.

P-side main stage 260 is driven in a nearly identical manner to N-side main stage 210. A voltage input 254, "$V_{IP}$," and a voltage reference signal 256, "$V_{RP}$," are applied to both P-side main stage 260 and a P-side replica stage 280.

P-side replica stage 280 is driven by current source 258 which also drives P-side replica bias stage 290. P-side replica bias stage 290 applies a bias voltage to P-side main bias stage 292. Voltage and current information from bias stage 290 is fed back via a feedback loop to P-side replica stage 280 to determine the bias voltage. Similar to N-side main bias stage 242, the bias voltage applied to P-side main bias stage 292 (created by the feedback relationship) is translated into current. This current drives P-side main stage 260.

Figure 3:
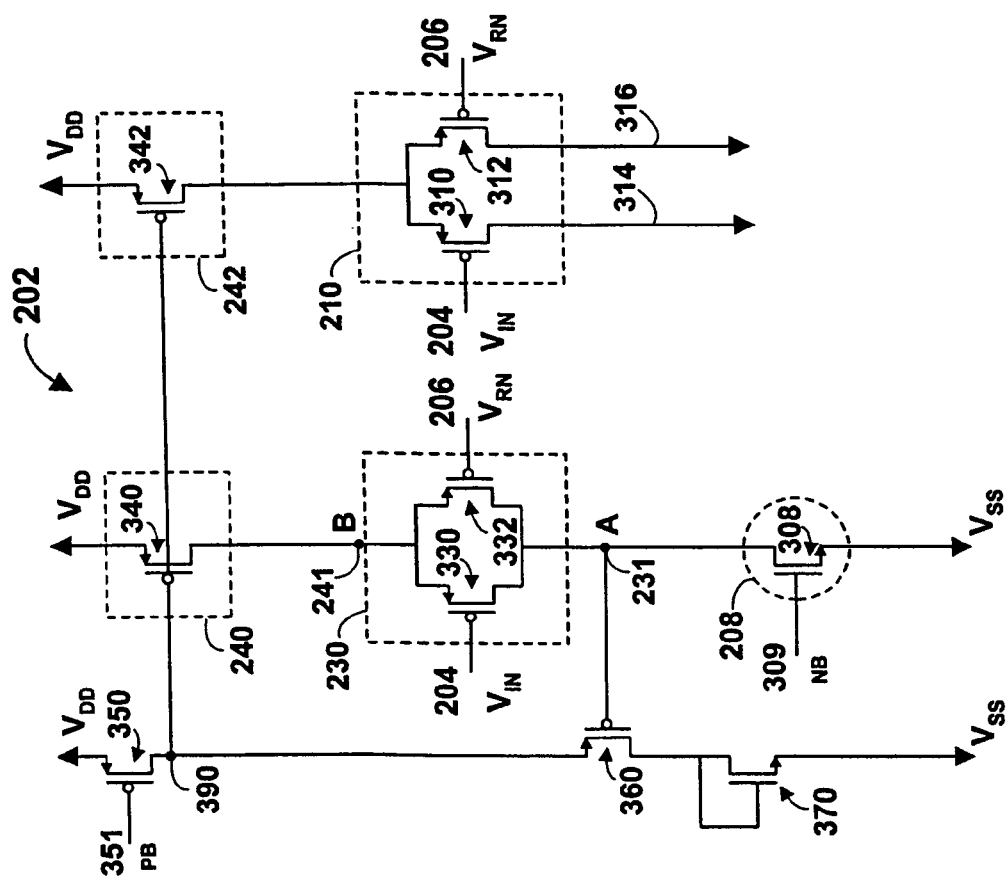
FIG. 3 is a schematic representation of the N-side of a differential amplifier in accordance with the present invention.

As shown in FIG. 2, N-side main stage 210 and P-side main stage 260 both have two outputs which are cross-coupled. These outputs, described in greater detail in connection with FIG. 3, are a function of voltage input 204 and voltage reference signal 206 (for N-side main stage 210), and voltage input 254 and voltage reference signal 256 (for P-side main stage 260). The N-side output that is a function of voltage input 204 is summed with the P-side output that is a function of voltage reference signal 256. This summed signal is differential output signal 248. Similarly, the P-side output that is a function of voltage input 254 is summed with the N-side output that is a function of voltage reference signal 206. This summed signal is differential output signal 298.

Turning to FIG. 3, N-side 202 of comparator 200 is shown in more detail. FIG. 3 illustrates that comparator 200 includes MOSFET (metal oxide semiconductor field effect transistor) devices and, in particular, "N"-type and "P"-type MOSFET devices ("NMOS" and "PMOS" for short). Use of NMOS and PMOS devices is merely exemplary. Circuits in accordance with the present invention can be designed using other devices such as, for example, BJTs (bipolar junction transistors) and JFETs (junction field effect transistors).

N-side replica stage 230 and N-side replica bias stage 240 are driven by current source 208. As shown, current source 208 may be an NMOS transistor such as transistor 308. The source of transistor 308 is tied to a reference power supply, $V_{SS}$. (Although the embodiments of the present invention are described using two power supplies (i.e., $V_{SS}$ and $V_{DD}$), the present invention can be designed using only one power supply.) Coupled to the gate of transistor 308 is a constant signal 309. Signal 309, "NB," is of ample strength to ensure that transistor 308 is in the saturation region and conducting when comparator 200 is on.

N-side replica stage 230 includes PMOS transistors 330 and 332. Transistors 330 and 332 preferably have matching M values (i.e., the same width to length ratios and the same orientation). As shown, N-side voltage-input 204 and N-side voltage reference signal 206 are applied to the gates of transistors 330 and 332, respectively. Transistors 330 and 332 are preferably matched such that their internal characteristics (e.g., width/length ratio, orientation) are identical. Voltage input 204, a differential input, may be time varying. As such, the current passing through each branch (i.e., through transistor 330 or 332) of N-side replica stage 230 may vary with time.

For example, because transistors 330 and 332 are matched, if voltage reference signal 206 is greater than voltage input 204, more current will pass through transistor 330. If voltage input 204 is insufficient to turn transistor 330 on, then all of the current being driven through replica stage 230 by current source 208 will pass through transistor 332. It is important to note for the moment that although the same amount of current will pass through N-side replica stage 230

(regardless of how much current passes through each branch), the voltage across the N-side replica stage 230 (measured from node "B" (i.e., node 241) to node "A" (i.e., node 231)) may vary with time. The significance of this will become more clear when the feedback relationship of the N-side replica stage 230 and replica bias stage 240 is described.

In any event, the current driven by current source 208 through N-side replica stage 230 (split through transistors 330 and 332 or driven through one of transistor 330 or 332 individually) appears at replica bias stage 240. Replica bias stage 240 includes PMOS transistor 340 with the source of the transistor tied to a reference power supply, $V_{DD}$.

A voltage is applied to the gate of transistor 340. This voltage is applied as a result of the feedback loop formed by transistors 340, 330, 332, and 360. As shown, transistor 350 is a PMOS device with its source tied to $V_{DD}$. Signal 351, "PB," is applied to the gate of transistor 350. Signal 351 is preferably of sufficient strength such that transistor 350 operates in saturation. The drain of transistor 350, shown as node 390, is coupled to the gate of transistor 340 of replica bias stage 240.

The drain of transistor 350 is also coupled to the source of transistor 360. Transistor 360 conducts the current driven by transistor 350. As shown, transistor 360 is a PMOS device arranged in a source-follower configuration from N-side replica stage 230. The drain of transistor 360 is coupled to the drain of transistor 370. Transistor 370 is an NMOS device that is provided to reduce stress on the circuit. In lieu of coupling the drain of transistor 360 to the drain of transistor 370, the drain of transistor 360 could alternatively be tied to $V_{SS}$. The gate of transistor 360 is coupled to the drain of transistor 308.

As stated previously, transistors 340, 330, 332, and 360 form a negative feedback loop. This feedback loop ensures that N-side main bias stage 242 is properly biased such that the outputs of N-side main stage 210, when cross-coupled with properly biased outputs of P-side main stage 260, will reject common mode differences. N-side replica stage 230 replicates N-side main stage 210. The bias voltage applied to the gate of transistor 340 (of N-side replica bias stage 240) is also applied to the gate of transistor 342 (of N-side main bias stage 242). Accordingly, because the current passing through N-side replica stage 230 and N-side replica bias stage 240 is constant, N-side main bias stage 240 will appear as a substantially constant current source to N-side main stage 210 irrespective of the time varying voltage signal of differential input signal 204.

As shown, properly biased transistor 342 drives current through transistors 310 and 312 of N-side main stage 210. Voltage input 204 and voltage reference signal 206 are applied to the gates of transistors 310 and 312, respectively. As is the case with transistors 330 and 332, transistors 310 and 312 preferably have matching M values. Additionally, the M values of transistors 310 and 312 are preferably proportional to the M values of transistors 330 and 332. Similarly, the M value of transistor 342 is preferably proportional to transistor 340 and in the same proportion as transistors 310 and 312 are to transistors 330 and 332.

The outputs of N-side main stage 210, outputs 314 and 316 of transistors 310 and 312 respectively, will be described in more detail in connection with FIG. 4.

P-side 252 of comparator 200 functions similarly to N-side 202 and need not be described in detail. P-side 252 is shown in FIG. 5 alongside N-side 202 illustrating the inputs and cross-coupled outputs (as also shown in FIG. 4) of circuit 200. To reject common mode input signals, the outputs of the properly biased N-side main stage are combined and cross-coupled with the outputs of the properly biased P-side main stage as described above in connection with FIG. 2 and described in more detail in connection with FIG. 4.

Figure 4:
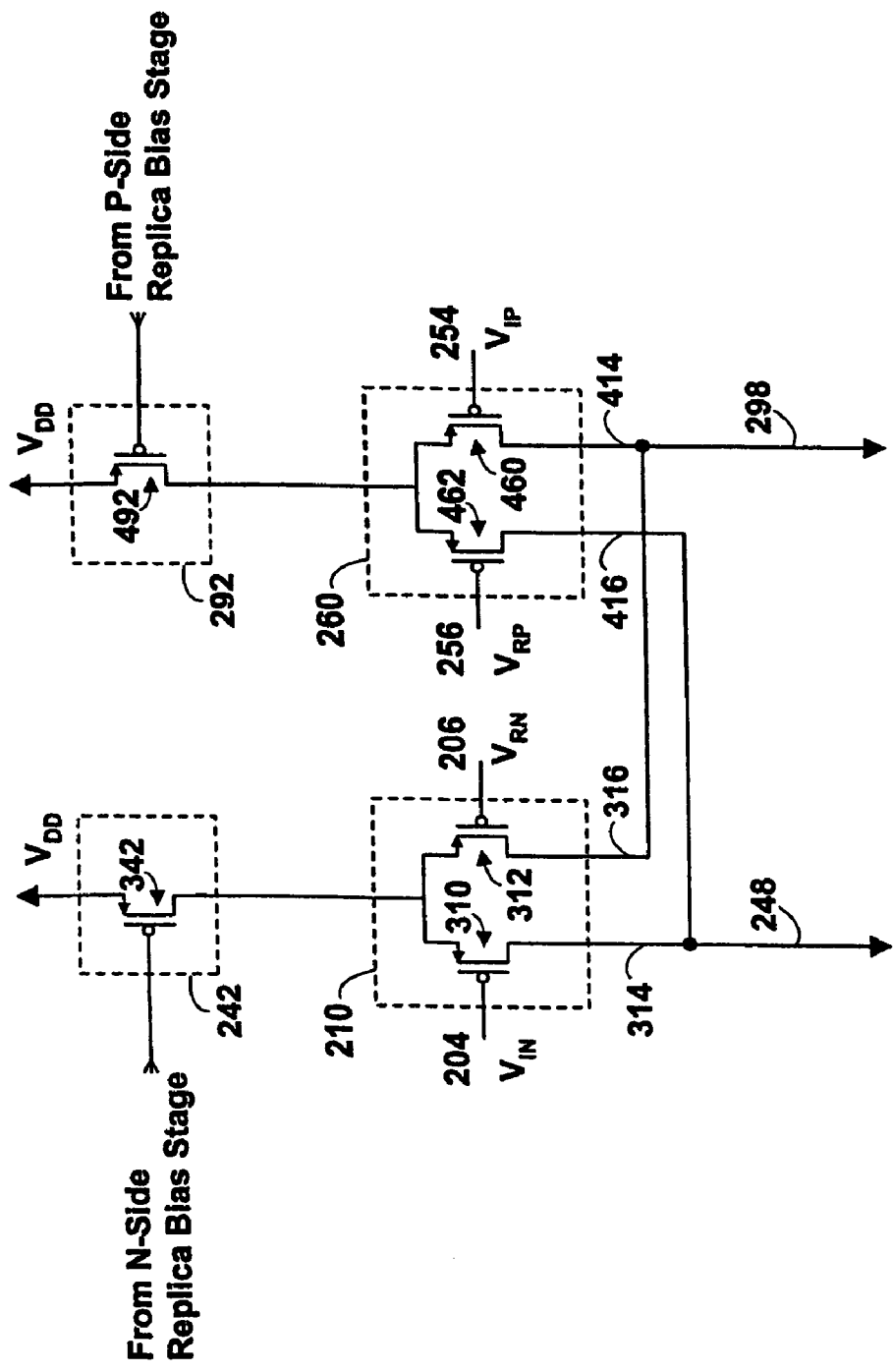
FIG. 4 is a schematic representation of two biased main stages and cross-coupled outputs in accordance with the present invention.
Figure 5:
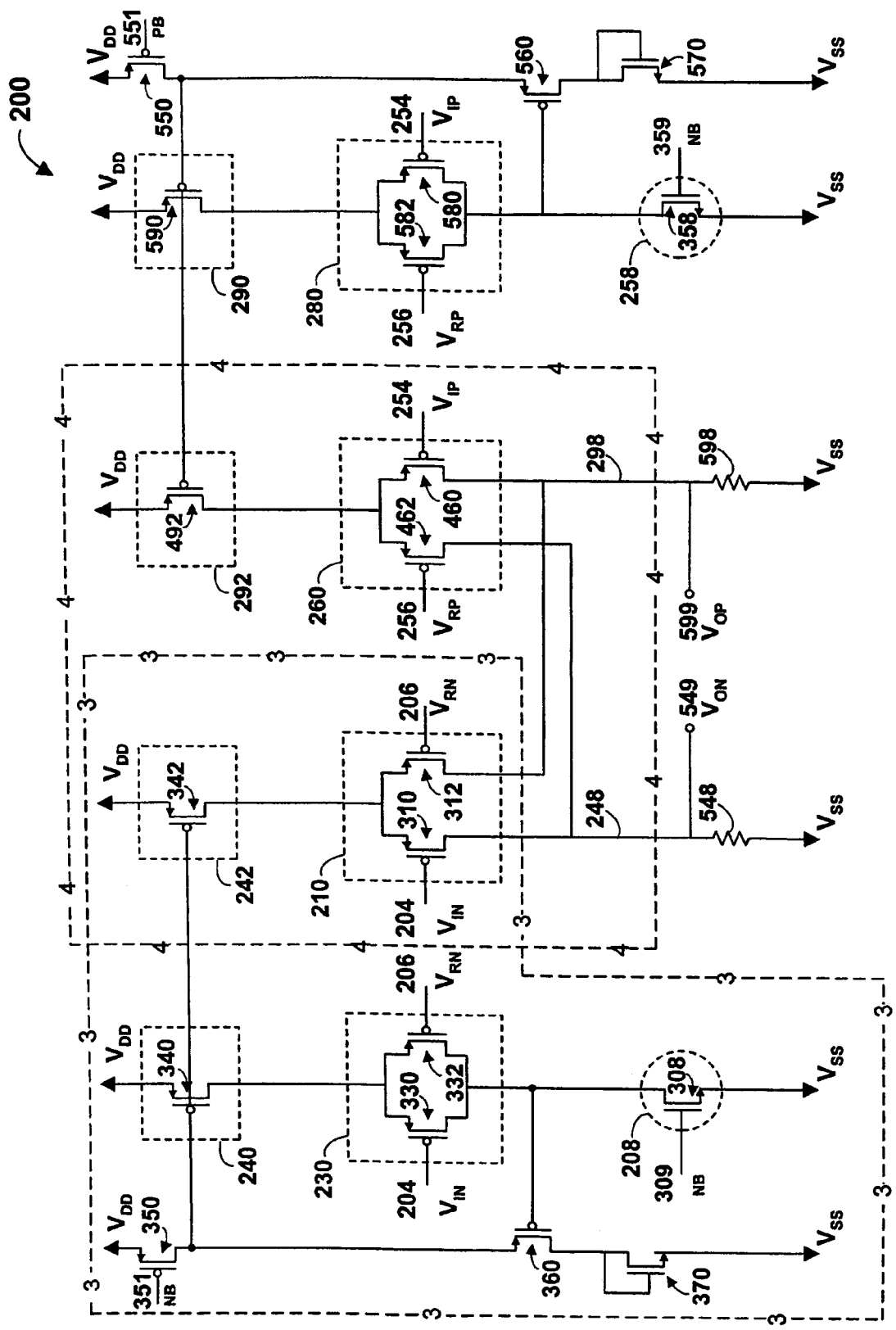
FIG. 5 is a schematic representation of a differential amplifier in accordance with the present invention.

As shown in FIG. 4, properly biased N-side main bias stage 242 and P-side main bias stage 292 drive N-side main stage 210 and P-side main stage 260, respectively. Transistors 342 and 492 of N-side main bias stage 242 and P-side main bias stage 292, respectively, should be matched well including matching M values and threshold voltages. Any mismatch will lead to an error in the output of circuit 200 as a reference level offset.

Transistor 310 is driven by N-side voltage input 204 and transistor 312 is driven by N-side reference voltage 206. Properly biased N-side main bias stage 242 drives current through transistors 310 and 312 based on the bias applied to transistor 342. The bias applied to transistor 342 ensures that the transistor 342 appears as a constant current source to N-side main stage 210. Similarly, the bias applied to transistor 492 ensures that transistor 492 appears as a constant current source to P-side main stage 260.

Because of the feedback relationship of the respective replica and replica bias stages, the respective main bias and main stages are properly biased such that outputs 314, 316, 414, and 416 are properly biased for common mode output rejection. Outputs 314, 316, 414, and 416 are cross-coupled to form two properly biased differential output signals 248 and 298.

To form N-side output signal 248, signal 314 is combined with signal 416. To form P-side output signal 298, signal 414 is combined with signal 316. The outcome is a properly biased differential pair with common mode rejection. A comparator designed in accordance with the present invention will be less sensitive to common mode differences than prior comparators.

FIG. 5 is a circuit diagram showing N-side 202 and P-side 252 of comparator 200 as well as the inputs to comparator 200 and the cross-coupled outputs of the N-side main stage and the P-side main stage. FIG. 5 is, in part, a reproduction of FIGS. 3 and 4 (shown surrounded by line "3-3" and "4-4," respectively) but is nonetheless illustrated for clarity of representing comparator 200 schematically as a whole.

FIG. 5 shows N-side 202 and P-side 252 including respective current sources 208, 258; replica stages 230, 280; main stages 210, 260; replica bias stages 240, 290; main bias stages 242, 292; voltage inputs 204, 254; and voltage reference signals 206, 256. Stage 280 is shown implemented as PMOS transistors 580 and 582 and stage 290 is shown implemented as PMOS transistor 590. FIG. 5 also shows the current source formed by transistor 350 and a current source formed by transistor 550. Signals 309 and 359 respectively applied to transistors 308 and 358 of current sources 208 and 258 are also shown.

Transistors 360 and 560, which form part of the feedback relationship for biasing the N-side and P-side main stages, as well as transistors 370 and 570 are also shown. The outputs of main stages 210 and 260 are shown cross-coupled to form differential outputs 248 and 298. These outputs are coupled to resistors 548 and 598. The resultant voltage across resistors 548 and 548, voltages "$V_{ON}$" and "$V_{OP}$", can be measured at nodes 549 and 599, respectively. The difference in voltages at nodes 549 and 599 is a common mode rejected differential output. The voltages at nodes 549 and 599 can, for example, be used to determine whether differential signal 254-204 is greater than differential reference signal 256-206 with greater accuracy than prior comparators. The voltages at nodes 549 and 599 may be compared at, for example, a latch stage (not shown).

Figure 6:
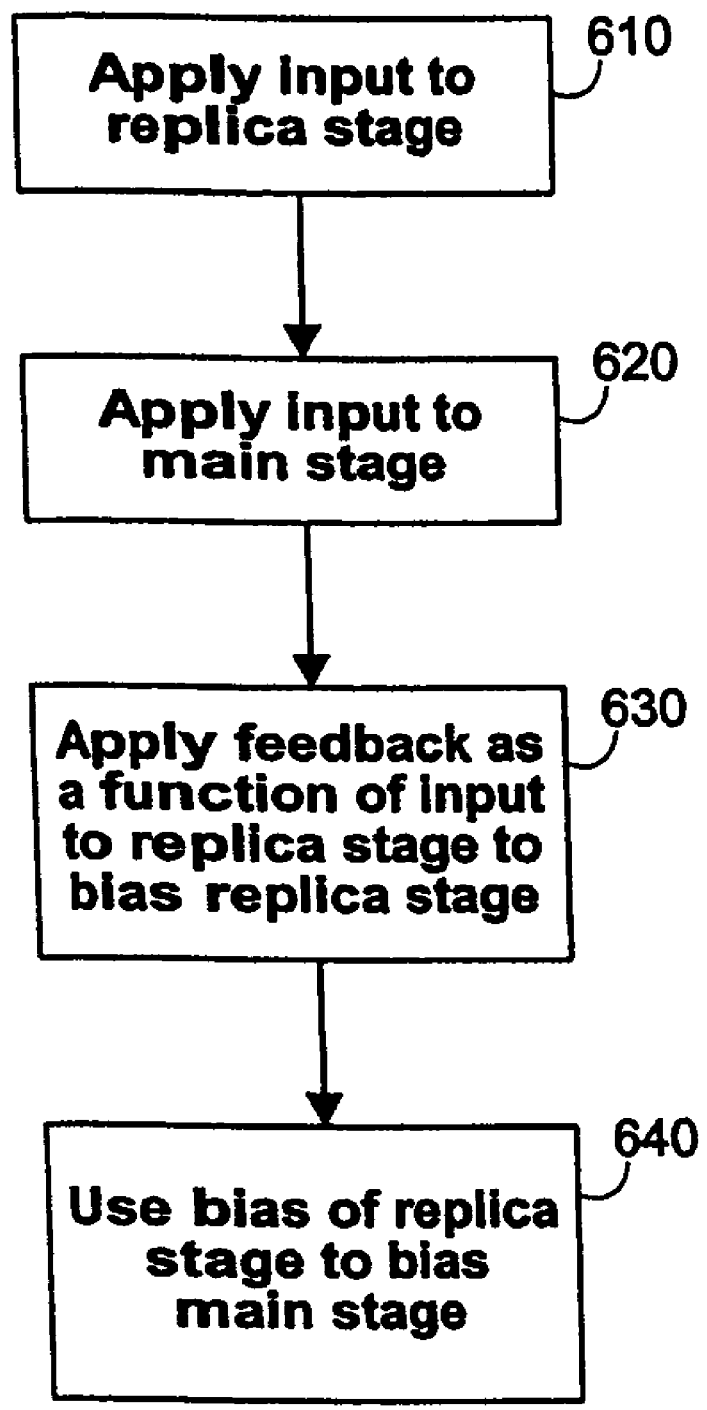
FIG. 6 is a flow chart of illustrative steps for biasing a differential comparator in accordance with the present invention.

FIG. 6 is a flowchart of steps for biasing according to the invention. At step 610, an input is applied to a replica stage. An input is applied to a main stage at step 620. Feedback is applied to the replica stage to bias the replica stage as a function of the input to the replica stage at step 630. The bias of the replica stage is used to bias a main stage 640.

Figure 7:
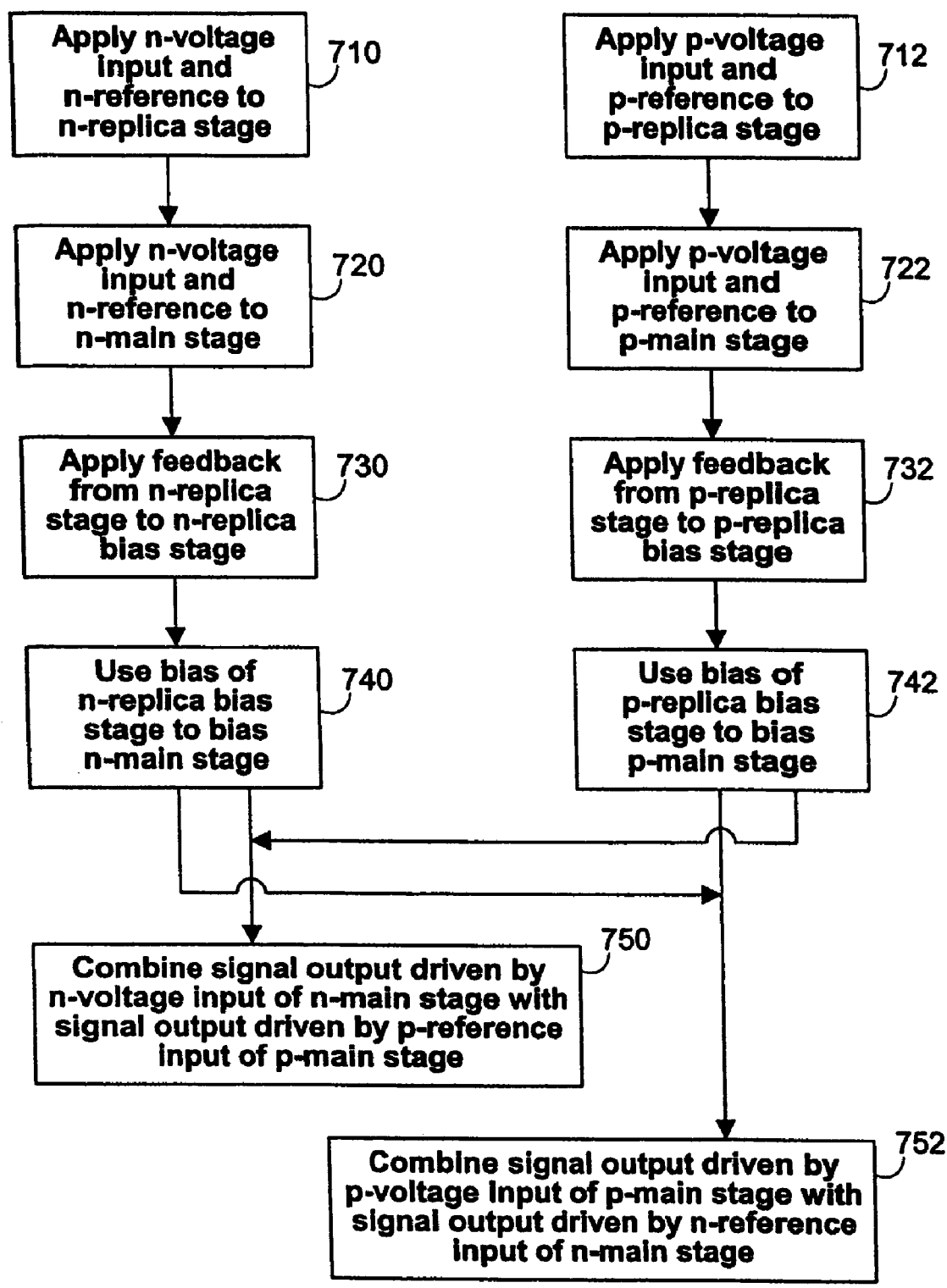
FIG. 7 is another flow chart of illustrative steps for biasing a differential comparator in accordance with the present invention.

FIG. 7 is another flowchart of steps for biasing according to the invention. In the flowchart of FIG. 7, a device with two differential half circuits such as a comparator is biased using an N-voltage input and a P-voltage input where the N-voltage input and P-voltage input form differential inputs.

Steps 710, 720, 730, and 740 are steps for applying input signals to and biasing the N-side of a device; steps 712, 722, 732, and 742 are steps for applying input to and biasing the P-side of the device. At step 710, an N-voltage input and N-reference signal are applied to an N-replica stage. The N-voltage input and an N-reference signal are applied to an N-main stage at step 720. At step 730, feedback from the N-replica stage is applied to an N-replica bias stage. The bias of the N-replica bias stage is used to bias the N-main stage at 740.

At step 712, a P-voltage input and a P-reference signal are applied to a P-replica stage. At step 722, the P-voltage input and P-reference signal are applied to a P-main stage at step 722. At step 732, feedback from the P-replica stage is applied to a P-replica bias stage. The bias of the P-replica bias stage is used to bias the P-main stage at step 742.

At steps 750 and 752, output signals of the N-main stage and P-main stage are combined. In particular, at step 750, the signal output driven by the N-voltage input of the N-main stage is combined with the signal output driven by the P-reference input of the P-main stage. At step 752, the signal output driven by the P-voltage input of the P-main stage is combined with the signal output driven by the N-reference input of the N-main stage.

Circuits designed in accordance with the present invention can be used in a wide variety of devices. For example, circuits designed in accordance with the present invention can be used in converters (e.g., analog-to-digital) and other applications that would benefit from the use of, for example, a differential comparator.

One skilled in the art will appreciate that the invention can be practiced by other than the described embodiments, which are presented for purposes of illustration and not of limitation, and the present invention is limited only by the claims which follow.

What is claimed is:

1. Differential comparator circuitry comprising:
   first replica circuitry comprising:
      input circuitry to receive a first input signal and a first reference signal and to provide a first bias signal;
      bias circuitry to provide a first control signal in response to the first bias signal, wherein the first bias signal and the first control signal form a first feedback loop;
   first main input circuitry to receive the first input signal and the first reference signal, wherein the first main input circuitry is biased in response to the first control signal;
   second replica circuitry comprising:
      input circuitry to receive a second input signal and a second reference signal and to provide a second bias signal;
      bias circuitry to provide a second control signal in response to the second bias signal, wherein the second bias signal and the second control signal form a second feedback loop;
   second main input circuitry to receive the second input signal and the second reference signal, wherein the second main input circuitry is biased in response to the second control signal; and
   wherein the first main input circuitry and the second main input circuitry are biased to provide an output signal that rejects common-mode differences in the first input signal and the second input signal.

2. The circuitry defined in claim 1 further comprising:
   first current source circuitry connected to the first replica circuitry.

3. The circuitry defined in claim 1 wherein the first replica input circuitry comprises:
   first and second transistors connected in parallel.

4. The circuitry defined in claim 3 wherein the first input signal is applied to a gate of the first transistor, and the first reference signal is applied to a gate of the second transistor.

5. The circuitry defined in claim 4 further comprising:
   first current source circuitry connected in series with the first and second transistors.

6. The circuitry defined in claim 5 wherein the first replica bias circuitry comprises:
   a third transistor that is connected in series with the first replica input circuitry and the first current source circuitry.

7. The circuitry defined in claim 6 wherein the first feedback loop of the first replica circuitry further comprises:
   a first feedback connection from a node intermediate the first replica input circuitry and the first current source circuitry to a gate of the third transistor.

8. The circuitry defined in claim 7 further comprising a first connection circuitry, wherein the first connection circuitry comprises:
   a fourth transistor connected in series with the first main input circuitry; and
   a first interstage connection from the first feedback connection to a gate of the fourth transistor.

9. The circuitry defined in claim 1 wherein the first and second input signals are differential signals.

10. The circuitry defined in claim 9 wherein the first main input circuitry comprises:
    fifth and sixth transistors.

11. The circuitry defined in claim 10 wherein the first input signal is applied to a gate of the fifth transistor, and the first reference signal is applied to a gate of the sixth transistor.

12. The circuitry defined in claim 11 wherein the second main input circuitry comprises:
    seventh and eighth transistors.

13. The circuitry defined in claim 12 wherein the second input signal is applied to a gate of the seventh transistor, and the second reference signal is applied to a gate of the eighth transistor.

14. The circuitry defined in claim 13 further comprising:
    a first tie connection between the fifth and eighth transistors.

15. The circuitry defined in claim 14 further comprising:
    a second tie connection between the sixth and seventh transistors.

16. Differential comparator circuitry comprising:
first replica circuit means comprising:
input circuit means for receiving a first input signal and a first reference signal and means for providing a first bias signal;
bias circuit means for providing a first control signal in response to the first bias signal, wherein the first bias signal and the first control signal means form a first feedback loop;
first main input circuit means for receiving the first input signal and the first reference signal, wherein the first main input circuit means is biased in response to the first control signal;
second replica circuit means comprising:
input circuit means for receiving a second input signal and a second reference signal and means for providing a second bias signal;
bias circuit means for providing a second control signal in response to the second bias signal, wherein the second bias signal and the second control signal means form a second feedback loop;
second main input circuit means for receiving the second input signal and the second reference signal, wherein the second main input circuit means is biased in response to the second control signal; and
wherein the first main input circuit and the second main input circuit means are biased for providing an output signal means for rejecting common-mode differences in the first input signal and the second input signal.

17. The circuitry defined in claim 16 further comprising:
first current source circuit means connected to the replica circuit means.

18. The circuitry defined in claim 16 wherein the replica input circuit means comprises:
first and second transistor means connected in parallel.

19. The circuitry defined in claim 18 wherein the first input signal is applied to gate means of the first transistor means, and the first reference signal is applied to a gate means of the second transistor means.

20. The circuitry defined in claim 19 further comprising:
first current source circuit means connected in series with the first and second transistor means.

21. The circuitry defined in claim 20 wherein the first replica bias circuit means comprises:
third transistor means that is connected in series with the replica input circuit means and the first current source circuit means.

22. The circuitry defined in claim 21 wherein the first feedback loop means of the replica circuit means further comprises:
first feedback connection means from a node intermediate the first replica input circuit means and the first current source circuit means to a gate means of the third transistor means.

23. The circuitry defined in claim 22 further comprising a first connection circuit means, wherein the first connection circuit means comprises:
fourth transistor means connected in series with the first main input circuit means; and
first interstage connection means from the first feedback connection means to a gate means of the fourth transistor means.

24. The circuitry defined in claim 16 wherein the first and second input signals are differential signals.

25. The circuitry defined in claim 24 wherein the first main input circuit means comprises:
fifth and sixth transistors means.

26. The circuitry defined in claim 25 wherein the first input signal is applied to gate means of the fifth transistor means, and a first reference signal is applied to gate means of the sixth transistor means.

27. The circuitry defined in claim 26 wherein the second main input circuit means comprises:
seventh and eighth transistor means.

28. The circuitry defined in claim 27 wherein the second input signal is applied to a gate means of the seventh transistor means, and a second reference signal is applied to a gate means of the eighth transistor means.

29. The circuitry defined in claim 28 further comprising:
first tie connection means between the fifth and eighth transistor means.

30. The circuitry defined in claim 29 further comprising:
second tie connection means between the sixth and seventh transistor means.

31. A method of operating differential comparator circuitry comprising:
a method of operating first replica circuitry comprising:
receiving a first input signal and a first reference signal and providing a first bias signal with input circuitry;
providing a first control signal in response to the first bias signal with bias circuitry, wherein the first bias signal and the first control signal form a first feedback loop;
receiving the first input signal and the first reference signal with first main input circuitry, wherein the first main input circuitry is biased in response to the first control signal;
a method of operating second replica circuitry comprising:
receiving a second input signal and a second reference signal and providing a second bias signal with input circuitry;
providing a second control signal in response to the second bias signal with bias circuitry, wherein the second bias signal and the second control signal form a second feedback loop;
receiving the second input signal and the second reference signal with second main input circuitry, wherein the second main input circuitry is biased in response to the second control signal; and
wherein the first main input circuitry and the second main input circuitry are biased to provide an output signal that rejects common-mode differences in the first input signal and the second input signal.

32. The method defined in claim 31 further comprising:
connecting first current source circuitry to the first replica circuitry.

33. The method defined in claim 31 further comprising:
connecting first and second transistors in parallel in the first replica input circuitry.

34. The method defined in claim 33 further comprising:
applying the first input signal to a gate of the first transistor; and
applying the first reference signal to a gate of the second transistor.

35. The method defined in claim 34 further comprising:
connecting first current source circuitry in series with the first and second transistors.

36. The method defined in claim 35 further comprising:
connecting a third transistor in series with the first replica input circuitry and the first current source circuitry.

37. The method defined in claim 36 further comprising:
connecting a node intermediate the first replica input circuitry and the first current source circuitry to a gate of the third transistor using a first feedback connection.

38. The method defined in claim 37 further comprising:
connecting a fourth transistor in series with the first main input circuitry; and
connecting the first feedback connection to a gate of the fourth transistor using a first interstage connection.

39. The method defined in claim 31 further comprising:
using the first of a pair of differential signals as the first input signal; and
using the second of the pair of differential signals as the second input signal.

40. The method defined in claim 39 further comprising:
using fifth and sixth transistors as the first main input circuitry.

41. The method defined in claim 40 further comprising:
applying the first input signal to a gate of the fifth transistor; and
applying a first reference signal to a gate of the sixth transistor.

42. The method defined in claim 41 further comprising:
using seventh and eighth transistors as the second main input circuitry.

43. The method defined in claim 42 further comprising:
applying the second input signal to a gate of the seventh transistor; and
applying a second reference signal to a gate of the eighth transistor.

44. The method defined in claim 43 further comprising:
tying the fifth and eighth transistors with a first tie connection.

45. The method defined in claim 44 further comprising:
tying the sixth and seventh transistors with a second tie connection.

* * * * *